(12) United States Patent
Benjamin Raj et al.

(10) Patent No.: US 12,159,785 B2
(45) Date of Patent: Dec. 3, 2024

(54) DYNAMIC MULTI ZONE FLOW CONTROL FOR A PROCESSING SYSTEM

(71) Applicant: Applied Materials, Inc., Santa Clara, CA (US)

(72) Inventors: Daemian Raj Benjamin Raj, Fremont, CA (US); Gregory Eugene Chichkanoff, Mountain View, CA (US); Shailendra Srivastava, Fremont, CA (US); Sai Susmita Addepalli, San Jose, CA (US); Nikhil Sudhindrarao Jorapur, Sunnyvale, CA (US); Abhigyan Keshri, Sunnyvale, CA (US); Allison Yau, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/464,805

(22) Filed: Sep. 11, 2023

(65) Prior Publication Data

US 2023/0420245 A1     Dec. 28, 2023

Related U.S. Application Data

(62) Division of application No. 16/844,794, filed on Apr. 9, 2020, now Pat. No. 11,798,803.
(Continued)

(51) Int. Cl.
    *C23C 16/455*      (2006.01)
    *C23C 16/458*      (2006.01)
    (Continued)

(52) U.S. Cl.
    CPC ...... *H01L 21/022* (2013.01); *C23C 16/45536* (2013.01); *C23C 16/45565* (2013.01);
    (Continued)

(58) Field of Classification Search
    CPC ............. C23C 16/4583; C23C 16/455; C23C 16/4412; C23C 16/18; C23C 16/4481;
    (Continued)

(56) References Cited

U.S. PATENT DOCUMENTS 6,086,677 A    7/2000   Umotoy et al.
6,245,192 B1    6/2001   Dhindsa et al.
(Continued)

FOREIGN PATENT DOCUMENTS

CN      102414799 A     4/2012
CN      106571319 A     4/2017
(Continued)

OTHER PUBLICATIONS

CN Office Action for Chinese Application No. 202080040111.9 dated Jan. 10, 2024.
(Continued)

*Primary Examiner* — Rudy Zervigon
(74) *Attorney, Agent, or Firm* — Patterson + Sheridan, LLP (57) ABSTRACT

In one example, a process chamber comprises a lid assembly, a first gas supply, second gas supply, a chamber body, and a substrate support. The lid assembly comprises a gas box, a gas conduit passing through the gas box, a blocker plate, and a showerhead. The gas box comprises a gas distribution plenum, and a distribution plate comprising a plurality of holes aligned with the gas distribution plenum. The blocker plate is coupled to the gas box forming a first plenum. The showerhead is coupled to the blocker plate forming a second plenum. The first gas supply is coupled to the gas distribution plenum, and the second gas supply system is coupled to the gas conduit. The chamber body is coupled to the showerhead, and the substrate support assembly is disposed within an interior volume of the chamber
(Continued)

body, and is configured to support a substrate during processing.

8 Claims, 6 Drawing Sheets

Related U.S. Application Data

(60) Provisional application No. 62/848,306, filed on May 15, 2019.

(51) Int. Cl.
| | | |
|---|---|---|
| *C23C 16/50* | (2006.01) | |
| *H01J 37/32* | (2006.01) | |
| *H01L 21/02* | (2006.01) | |
| *H10B 41/20* | (2023.01) | |
| *H10B 43/20* | (2023.01) | |

(52) U.S. Cl.
CPC .......... *C23C 16/4583* (2013.01); *C23C 16/50* (2013.01); *H01J 37/3244* (2013.01); *H01J 37/32449* (2013.01); *H01L 21/02164* (2013.01); *H01L 21/0217* (2013.01); *H01L 21/02274* (2013.01); *H10B 41/20* (2023.02); *H10B 43/20* (2023.02)

(58) Field of Classification Search
CPC .. H01J 37/3244; H01J 37/32449; B05D 1/60; H01L 45/1616
USPC ............... 118/715; 156/345.33, 345.34; 427/248.1, 569, 570, 533, 535, 96.8, 237, 427/255.23, 255.28; 216/58, 67
See application file for complete search history.

(56) References Cited

U.S. PATENT DOCUMENTS

| | | | |
|---|---|---|---|
| 6,415,736 | B1 | 7/2002 | Hao et al. |
| 9,818,606 | B2 | 11/2017 | Wang et al. |
| 2001/0027026 | A1 | 10/2001 | Dhindsa et al. |
| 2003/0019580 | A1 | 1/2003 | Strang |
| 2007/0066038 | A1 | 3/2007 | Sadjadi et al. |
| 2007/0234962 | A1 | 10/2007 | Suzuki et al. |
| 2012/0111271 | A1* | 5/2012 | Begarney .......... C23C 16/45565 118/724 |
| 2012/0234945 | A1* | 9/2012 | Olgado ............... B05B 1/005 239/589 |
| 2015/0214044 | A1 | 7/2015 | Yanai et al. |
| 2017/0101712 | A1 | 4/2017 | Bansal et al. |
| 2018/0230597 | A1 | 8/2018 | Ma et al. |
| 2019/0066998 | A1* | 2/2019 | Hawrylchak ..... H01L 21/02046 |
| 2019/0100839 | A1 | 4/2019 | Bansal et al. |

FOREIGN PATENT DOCUMENTS

| | | |
|---|---|---|
| JP | 2007335755 A | 12/2007 |
| WO | 2017081924 A1 | 5/2017 |

OTHER PUBLICATIONS

Taiwan Office Action for Application No. 109115989 dated Nov. 24, 2023.
Singapore Written Opinion for Application No. 11202112203V dated Dec. 21, 2023.
International Search Report and Written Opinion Application No. PCT/US2020/027523 dated Jul. 29, 2020 consists of 11 pages.
Taiwan Office Action dated Jul. 23, 2024 for Application No. 109115989.
CN Office Action in related application CN 202080040111.9 dated Jul. 31, 2024.
JP Office Action for Japanese Application No. 2021-567825 dated Apr. 16, 2024.

* cited by examiner

DYNAMIC MULTI ZONE FLOW CONTROL FOR A PROCESSING SYSTEM

CROSS-REFERENCE TO RELATED APPLICATIONS

This application is a divisional of U.S. patent application Ser. No. 16/844,794, filed Apr. 9, 2020, which claims priority to U.S. Provisional Patent Application 62/848,306, filed on May 15, 2019, the disclosure of which are each incorporated herein by reference in their entirety.

BACKGROUND

Field

Embodiments of the present disclosure generally relate to systems and methods for the dynamic control of the flow of gases during substrate processing.

Description of the Related Art

Many semiconductor devices are commonly created by forming multiple layers of different materials on the surface of a substrate. In many instances, the semiconductor devices include stacks of multiple tiers of multiple layers of different materials. For example, in a 3D NAND memory, multiple tiers of oxide and nitride layers are vertically stacked to form the corresponding memory cells. The number of oxide and nitride tiers may be in a range of about 50 tiers to about 300 tiers, or more. During processing, each layer that is deposited experiences a relatively small amount of localized stress non-uniformity (e.g., in-plane distortion). However, as the number of layers increases, the cumulative localized stress non-uniformity experienced by each layer increases. Further, in many semiconductor devices, due to the large number of layers, the cumulative localized stress non-uniformity experienced may cause a failure in the semiconductor device.

Thus, there is a need for a dynamically tunable apparatus for reducing localized stress non-uniformity.

SUMMARY

In one embodiment, a lid assembly for a process chamber comprises a gas box, a gas conduit, and a blocker plate. The gas box comprises a gas distribution plenum coupled to a first gas supply system, and a distribution plate comprising a plurality of holes aligned with the gas plenum. The gas conduit passes through the gas box and is coupled to a second gas supply system. The blocker plate is coupled to the gas box, and a first plenum is formed between the blocker plate and the gas box.

In one embodiment, a process chamber comprises a lid assembly, a first gas supply, second gas supply, a chamber body, and a substrate support. The lid assembly comprises a gas box, a gas conduit passing through the gas box, a blocker plate, and a showerhead. The gas box comprises a gas distribution plenum and a distribution plate. The distribution plate comprises a plurality of holes aligned with the gas distribution plenum. The blocker plate is coupled to the gas box and a first plenum is formed between the blocker plate and the gas box. The showerhead is coupled to the blocker plate, and a second plenum is formed between the showerhead and the blocker plate. The first gas supply is coupled to the gas distribution plenum, and the second gas supply system is coupled to the gas conduit. The chamber body is coupled to the showerhead, and the substrate support assembly is disposed within an interior volume of the chamber body, and is configured to support a substrate during processing.

In one embodiment, a method for processing a substrate comprises providing, by a first gas supply system, a first gas to a gas distribution plenum of a gas box. The first gas flows out of the gas distribution plenum through a gas distribution plate to a first plenum formed between a blocker plate and the gas box. The method further comprises providing, by a second gas supply system, a second gas to the first plenum, the second gas flows through a gas conduit passing through the gas box. The first gas mixes with the second gas in at least a portion of the first plenum.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized in other embodiments without specific recitation thereof with respect thereto.

DETAILED DESCRIPTION

Multiple layers of different materials may be deposited on a substrate to generate various different semiconductor devices. For example, to generate 3D NAND memory may, multiple tiers of oxide and nitride layers are deposited on a substrate. The number of oxide and nitride tiers may be in a range of about 50 tiers to about 300 tiers. However, other numbers of tiers are also contemplated. Each individual layer may have a relatively small localized stress non-uniformity (e.g., in-plane distortion); however, as the number of tiers increases, the localized stress non-uniformity in the layers may accumulate such that layers that are deposited later in the process experience a higher cumulative localized stress non-uniformity than layers that are deposited earlier in the process. By applying one or more additional gases into select portions of the process chamber during the operations of the substrate processing, the cumulative localized stress non-uniformity in the layers may be reduced, reducing the in-plane distortion of each layer. Accordingly, the number of layers that may be deposited is increased as compared to processing systems that do not employ the use of additional gases.

Figure 1A:
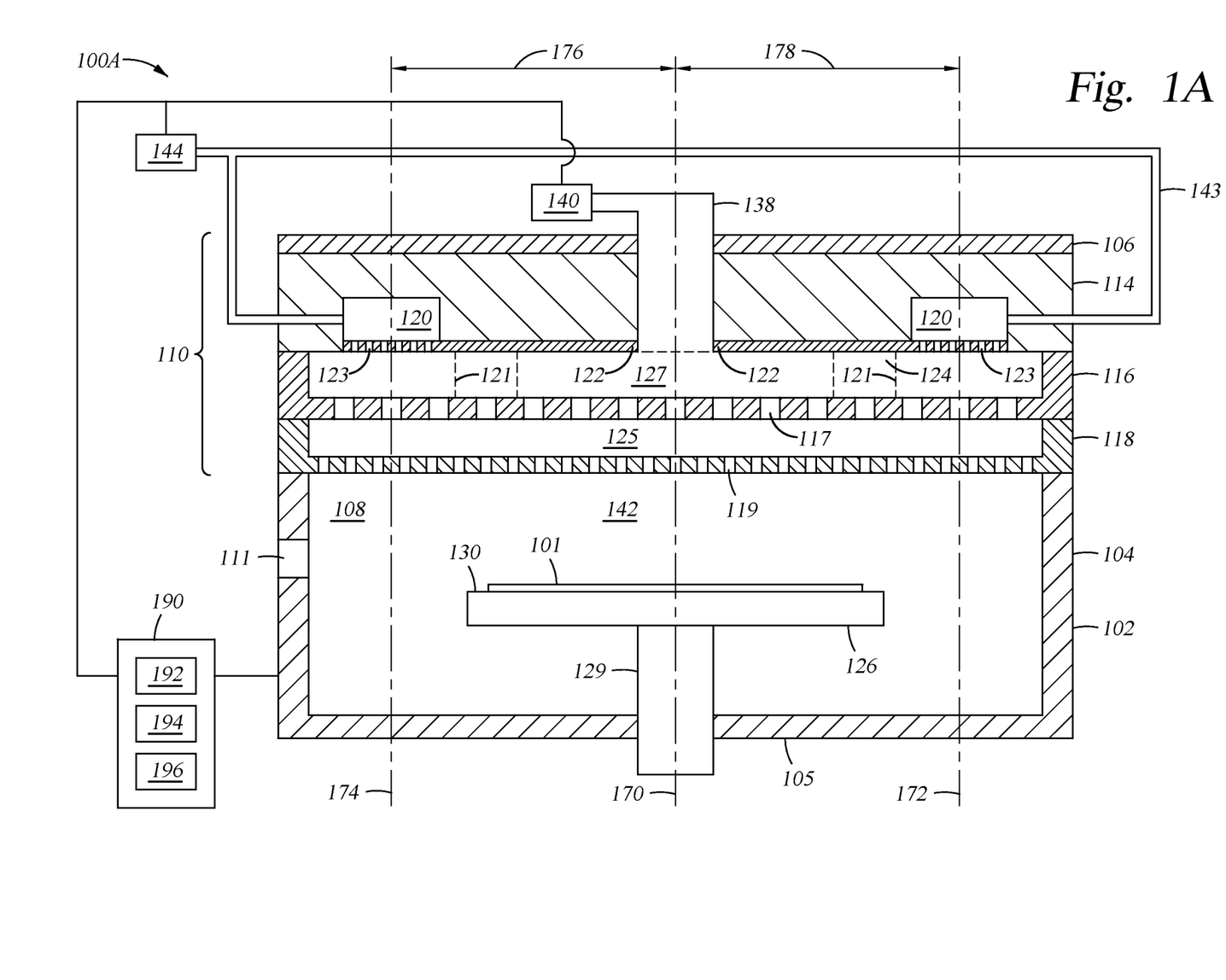
FIGS. 1A and 1B are schematic illustrations of a process chamber, according to one or more embodiments.

FIG. 1A illustrates a process chamber 100A, according to one or more embodiments. The process chamber 100A includes a chamber body 102 having sidewalls 104, a bottom 105, and a lid assembly 110. The sidewalls 104 and showerhead 118 of the lid assembly 110 define an processing volume 108. A substrate transfer port 111 is formed in the sidewall 104 for transferring substrates into and out of the processing volume 108. The process chamber 100A may be of one a chemical vapor deposition (CVD) process chamber, an atomic layer deposition (ALD) process chamber, a metalorganic chemical vapor deposition (MOCVD) process chamber, a plasma-enhanced chemical vapor deposition (PECVD) process chamber, and a plasma-enhanced atomic layer deposition (PEALD) process chamber, among others.

A substrate support assembly 126 is disposed within the processing volume 108 of the process chamber 100A below the lid assembly 110. The substrate support assembly 126 is configured to support a substrate 101 during processing. The substrate support assembly 126 may include a plurality of lift pins (not shown) movably disposed therethrough. The lift pins may be actuated to project from a support surface 130 of the substrate support assembly 126, thereby placing the substrate 101 in a spaced-apart relation to the substrate support assembly 126 to facilitate transfer with a transfer robot (not shown) through the substrate transfer port 111. The substrate support assembly 126 is coupled to the shaft 129 to facilitate vertical actuation and/or rotation of the substrate support assembly 126.

The lid assembly 110 includes a lid 106, a gas box 114, a blocker plate 116, and a showerhead 118. The gas box 114 includes a gas distribution plenum 120 and a distribution plate 122 formed on a lower surface of the gas box 114. The distribution plate 122 includes apertures (e.g., holes or openings) 123 which are aligned with the gas distribution plenum 120. One or more gases flow out of the gas distribution plenum 120 and through the apertures 123 of the gas distribution plenum 120.

The gas distribution plenum 120 is coupled with the gas supply system 144 via conduit 143. The gas supply system 144 supplies, or provides, one or more gases to the gas distribution plenum 120. One or more elements of the gas supply system 144 is mounted to the lid assembly 110. The gas supply system 144 supplies at least one of one or more precursors or one or more inert gases to the gas distribution plenum 120. For example, the gas supply system 144 may supply one or more precursors such as silane (SiH4) and tetraethyl orthosilicate (TEOS), among others. Further, the gas supply system 144 may supply one or more inert gases such as argon (Ar) and helium (He), among others. Additionally, or alternatively, the gas supply system 144 is configured to simultaneously supply a precursor gas and an inert gas to the gas distribution plenum 120.

A plenum 124 is formed between the gas box 114 and the blocker plate 116. Further, a plenum 125 is formed between the blocker plate 116 and a showerhead 118. The blocker plate 116 includes apertures 117 and the showerhead 118 includes apertures 119 through which gases flow into the processing volume 142.

The process chamber 100A further includes a central conduit 138. The central conduit 138 passes through the gas box 114. For example, the central conduit 138 is formed through the lid 106 and the gas box 114 and opens into the plenum 124. The central conduit 138 is configured to provide one or more process gases, such as deposition gases and/or carrier gases, to the plenum 124 from the gas supply system 140. In the plenum 124, at least a portion of the process gas or gases supplied by the gas supply system 140 via central conduit 138 mixes with the gases introduced from the gas distribution plenum 120. For example, the process gases introduced by the gas supply system 140 mix with the gases introduced by the gas supply system 144 in regions 121 of the plenum 124. Mixing the process gas or gases in the regions 121 dilutes the process gas or gases in those regions, altering one or more properties of the deposited film due to localized concentration changes of the process gas during deposition. For example, one or more precursors and inert gases may be utilized to alter the in-plane distortion such that in-plane distortion is more or less tensile and/or compressive. Further, by selectively applying one or more precursor gases and/or one or more inert gases during different operations of a process recipe, the in-plane distortion may be further altered to make the in-plane distortion more or less tensile and/or compressive.

Flowing one or more gases through the gas distribution plenum 120 may alter at least one of the in-plane distortion and the localized stress non-uniformity of a layer on the substrate 101. For example, flowing an inert gas through the gas distribution plenum 120 may dilute and disperse the processing gases in at least regions 121. The processing gas may remain diluted at a radial location corresponding to the regions 121 as the processing gas travels through the blocker plate 116 and the showerhead 118, thus affecting properties of the material deposited on the substrate 101.

The plurality of apertures 117 of the blocker plate 116 allows for fluid communication between the plenum 124 and the plenum 125. The blocker plate 116 is configured to disperse and facilitate further mixing of the gas mixture introduced to the plenum 125. The plenum 125 is in fluid communication with a processing volume 142 defined between the showerhead 118 and the substrate support assembly 126 through a plurality of apertures 119 formed through the showerhead 118. The apertures 119 provide fluid communication between the plenum 125 and the processing volume 142.

A first gas is supplied by the gas supply system 144 into the gas distribution plenum 120 and flows out of the gas distribution plenum 120 and through the apertures 123 in the distribution plate 122 into the plenum 124. A process gas is supplied by the gas supply system 140 and flows through the central conduit 138 into the plenum 124. The first gas and the process gas mix within the regions 121 of the plenum 124 and the mixed gases flow through the apertures 117 of the blocker plate 116 into the plenum 125. Further, in region 127 of the plenum 124, the process gas does not mix, or has reduced mixing compared to region 121, with the first gas and only the process gas flows through the blocker plate 116 in the region 127. Further, the gases flow through the apertures 119 of the showerhead 118 into the processing volume 142.

Center line 170 bifurcates the process chamber 100A into two equal portions. Additionally, center line 172 bifurcates a first portion of the gas distribution plenum 120 and center line 174 bifurcates a second portion of the gas distribution plenum 120. Stated otherwise, centerlines 172 and 174 are located at the radial center position of the distribution plenum 120. Further, the distances 176 and 178 between the center line 170 and center lines 172 and 174 is in a range of about 70 mm to about 160 mm, and may be equidistant. Alternatively, the distances 176 and 178 between the center line 170 and center lines 172 and 174 may be less than about 70 mm or greater than about 160 mm.

A controller 190 is coupled to the process chamber 100A. The controller 190 includes a central processing unit (CPU) 192, a memory 194, and support circuits 196. The controller 190 is utilized to control the amount of and the type of gas supplied to the gas distribution plenum 120 by the gas supply system 144. Controlling the type of gas and the amount of gas supplied to the gas distribution plenum 120 alters process gas or gases supplied by the gas supply system 140 via the central conduit 138. For example, the controller 190 supplies a first gas at a first rate to dilute the processing gas within the regions 121 of the plenum 124. The controller 190 may be configured to alter at least one of the gas or gases supplied by the gas supply system 144 and the rate at which the gas or gases are supplied by the gas supply system 144 based on a processing recipe.

The CPU 192 may be of any form of a general purpose computer processor that can be used in an industrial setting. The software routines can be stored in the memory 194, such as random access memory, read only memory, floppy or hard disk drive, or other form of digital storage. The support circuits 196 are coupled to the CPU 192 and may comprise cache, clock circuits, input/output subsystems, power supplies, and the like. The software routines, when executed by the CPU 192, transform the CPU 192 into a specific purpose computer (controller) 190 that controls the process chamber 100A such that the processes are performed in accordance with the present disclosure. The software routines may also be stored and/or executed by a second controller (not shown) that is located remotely from the chamber.

Figure 1B:
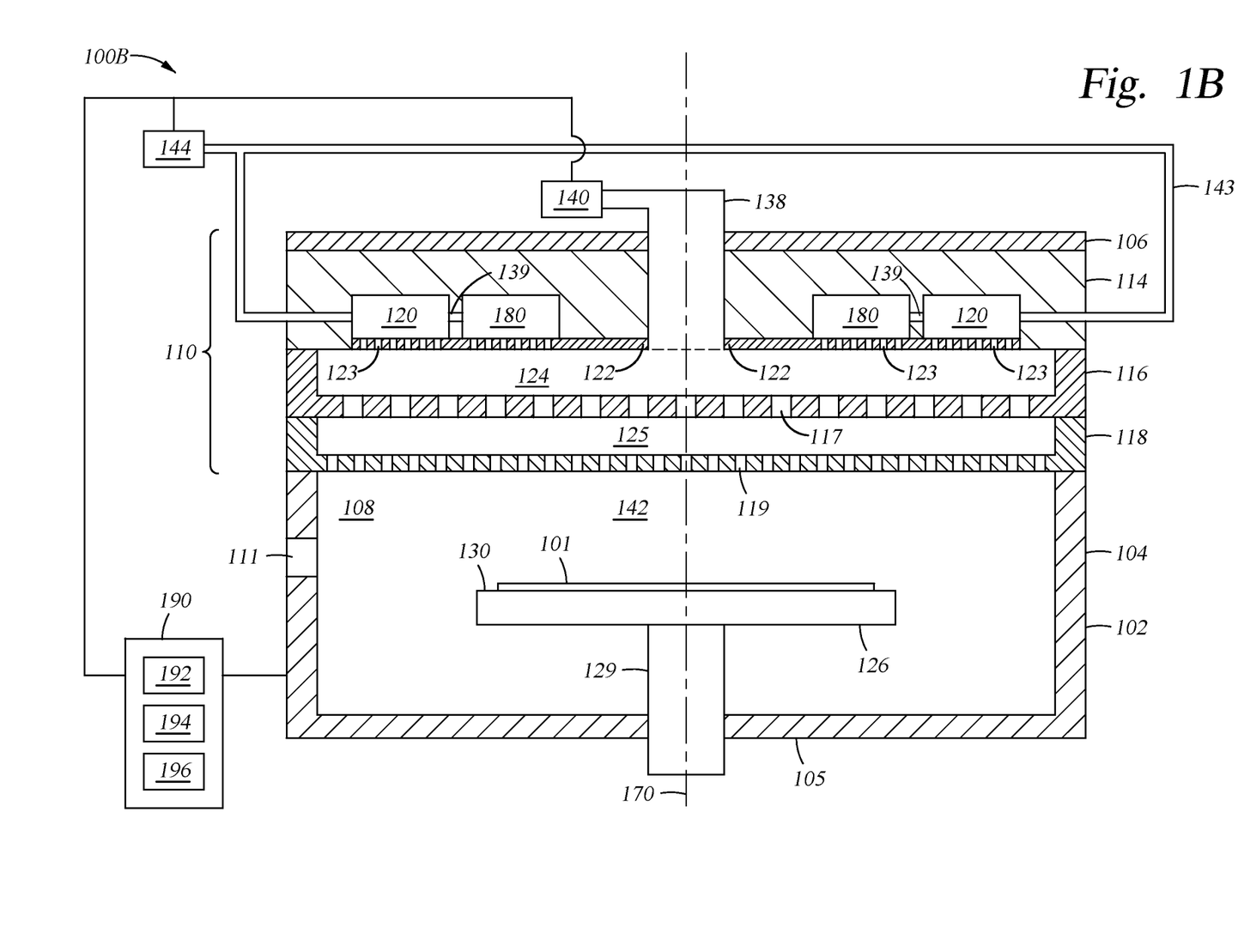

FIG. 1B illustrates a process chamber 100B having an additional gas distribution plenum 180, according to one or more embodiments. The gas distribution plenum 180 is configured similar to that of the gas distribution plenum 120. The gas distribution plenum 180 and the gas distribution plenum 120 may be concentric circles. Further, the gas distribution plenum 180 is fluidly coupled to the gas distribution plenum 120. The gas supply system 144 supplies, or provides, one or more gases to the gas distribution plenum 180 via the gas distribution plenum 120 and the conduit 143. The inclusion of the gas distribution plenum 180 increases the volume where the gases provided by the gas distribution plenums 120 and 180 mix with the processing gases provided via the central conduit 138, further altering the effects of the processing gas on the substrate 101.

The gas distribution plenums 120 and 180 may be similar in size (e.g., have a common height and width). Alternatively, one of the gas distribution plenums 120 and 180 may be larger than the other (e.g., larger in one or more of height and width). Further, the distribution plate 122 includes apertures 123 aligned with the gas distribution plenum 120 and the gas distribution plenum 180. The gas distribution plenums 120 and 180 are coupled together by the conduit 139.

A center of the gas distribution plenum 180 may be in a range of about 70 mm to about 95 mm from the center line 170. Further, the center of the gas distribution plenum 120 may be in a range of about 100 mm to about 130 mm from the center line 170. For example, the gas distribution plenum 180 is about 75 mm from the center line 170 and the center of the gas distribution plenum 120 is be about 125 mm from the center line 170. Alternatively, the gas distribution plenum 180 is about 90 mm from the center line 170 and the center of the gas distribution plenum 120 is be about 125 mm from the center line 170.

While FIG. 1B illustrates a gas box (e.g., gas box 114) of a process chamber (e.g., the process chamber 100B) having two gas distribution plenums (e.g., gas distribution plenums 120, 180), a gas box may include more than two gas distribution plenums. For example, a gas box may have three or more gas distribution plenums. Each of the gas distribution plenums are fluidly coupled together by a conduit (e.g., the conduit 139) and one of the gas distribution plenums is coupled to the gas supply system (e.g., the gas supply system 144). Further, each of the gas distribution plenums may have a common size (e.g., a common width and height), or one or more of the gas distribution plenums may be larger than the other (e.g., have a larger height and/or width). The size of the of gas distribution plenums 120, 180, as well as the size of the conduit 139, can be varied according to a desired flow rate out of the corresponding the gas distribution plenums, which varies how the corresponding gases mix with the processing gases, varying the corresponding effects on the substrate 101. Further, the size of the gas distribution plenums 120, 180, the conduit 139, and the apertures 123, can be varied according to a desired conductance.

Figure 2:
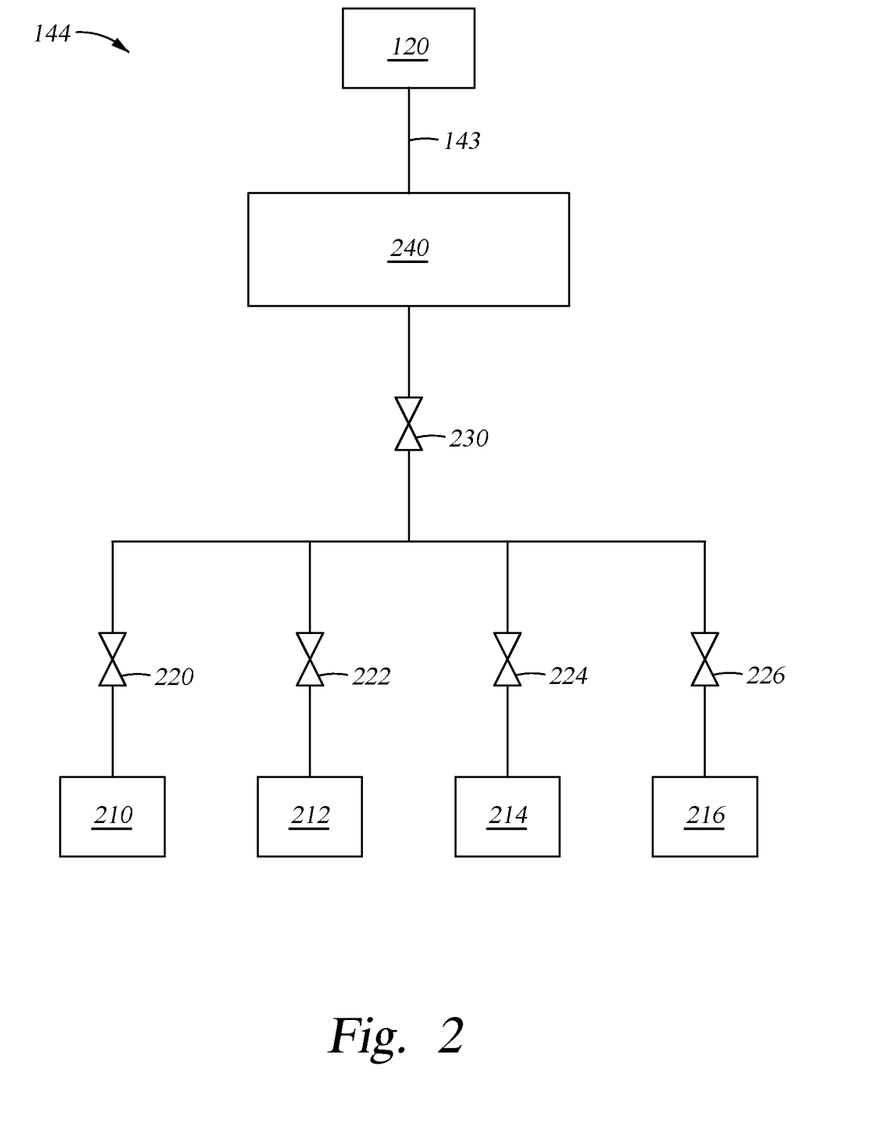
FIG. 2 is a schematic illustration of gas supply system, according to one or more embodiments.

FIG. 2 illustrates the gas supply system 144 according to one or more embodiments. The gas supply system 144 includes gas supplies 210, 212, 214 and 216, valves 220, 222, 224 and 226, and a manifold 240. The manifold 240 is fluidly coupled to the gas distribution plenum 120. For example, the manifold 240 is coupled to the gas distribution plenum 120 via the conduit 143. Additionally, one or more valves 230 may be positioned between the manifold 240 and the conduit 143, along the conduit 143, and/or between the conduit 143 and the gas distribution plenum 120.

Each of the gas supplies 210, 212, 214 and 216 are configured to supply a different type, composition, and/or concentration of gas. For example, one or more of the gas supplies 210, 212, 214 and 216 is configured to supply a precursor gas and a second one or more of the gas supplies 210, 212, 214 and 216 is configured to supply an inert gas. Additionally, or alternatively, two of the gas supplies 210, 212, 214 and 216 may supply a precursor and two of the gas supplies 210, 212, 214 and 216 may supply an inert gas. For example, the gas supply 210 may supply a first precursor gas, and the gas supply 212 may supply a second precursor gas different than the first precursor gas. Further, the gas supply 214 may supply a first inert gas, and the gas supply 216 may supply a second inert gas different than the first inert gas. The first precursor gas is silane and the second precursor gas is TEOS. Further, the first inert gas is argon, and the second inert gas is helium. Alternatively, different precursor and/or inert gases may be utilized. For example, one or more of the gas supplies 210, 212, 214, and 216 may be configured to provide ammonia ($NH_3$).

While FIG. 2 illustrates a gas supply system 144 as including four gas supplies 210, 212, 214 and 216 and four valves 220, 222, 224 and 226, alternatively, the gas supply system 144 may include less than four gas supplies and valves, or more than four gas supplies and valves. Additionally, or alternatively, two or more gas supplies may be coupled to a common valve. For example, the gas supplies 210 and the 212 may be coupled to the valve 220.

The valves 220, 222, 224, and 226 control the flow of gas from a corresponding one of the gas supplies 210, 212, 214 and 216. For example, the valve 220 controls the flow of gas out of the gas supply 210, the valve 222 controls the flow of gas out of the gas supply 212, the valve 224 controls the flow of gas out of the gas supply 214, and the valve 226 controls the flow of gas out of the gas supply 216. Further, the valve 230 controls the flow of gas into the manifold 240. The valves 220, 222, 224 and 226 may be independently controlled by the controller 190. Additional valves may be added or subtracted based on the number of gas supplies of the gas supply system 144 and the number of connections to the manifold 240.

The manifold 240 receives one or more gases from the gas supplies 210, 212, 214 and 216 and outputs one or more gases to the gas distribution plenum 120. The manifold 240 controls the flow of gas, e.g., rate of gas flow, from the gas supplies 210, 212, 214 and 216 to the gas distribution plenum 120. Further, the manifold 240 may mix two or more gases suppled from two or more of the gas supplies 210, 212, 214 and 216 and output a mixed gas to the gas distribution plenum 120. The valve 230 is fluidly coupled to the output of each of the valves 220, 222, 224 and 226 and controls the flow of gas into the manifold 240. Alternatively, the valve 230 may be omitted and the output of each of the valves 220, 222, 224 and 226 may be directly connected to the manifold 240.

The controller 190 (shown in FIG. 1) controls the flow rate of gas out of each gas supply 210, 212, 214, 216 by controlling the period of time that each of the corresponding valves 220, 222, 224 and 226 are open. For example, the controller 190 may instruct the valve 220 to open to allow gas to flow from the gas supply 210 into the manifold 240 for a first period of time, and to close to stop the flow of gas from the gas supply 210 into the manifold 240. The controller 190 may instruct the valve 222 to open to allow gas to flow from the gas supply 212 into the manifold 240 for a second period of time, and to close to stop the flow of gas from the gas supply 212 into the manifold 240. Further, the controller 190 may instruct the valve 224 to open to allow gas to flow from the gas supply 214 into the manifold 240 for a third period of time, and to close to stop the flow of gas from the gas supply 214 into the manifold 240. Additionally, the controller 190 may instruct the valve 226 to open to allow gas to flow from the gas supply 216 into the manifold 240 for a fourth period of time, and to close to stop the flow of gas from the gas supply 216 into the manifold 240. The first, second, third and fourth periods may be non-overlapping, or at least two of the first, second, third and fourth periods may at least partially overlap. For example, when at least two of the first, second, third, and fourth periods at least partially overlap, two or more or the gases may be referred to as being simultaneously supplied. Further, the length and occurrence of the first, second, third, and fourth periods may correspond to a step of a process recipe for processing a substrate.

The controller 190 may control the flow of gas through each valve 220, 222, 224 and 226 based on the operations of a process recipe for processing a substrate to generate a semiconductor device. For example, the process recipe may include multiple operations of generating a first type of plasma and a second type of plasma to deposit a first layer and a second layer on a substrate. The first type of plasma may correspond to an oxide plasma and the second type of plasma may correspond to a nitride plasma. The oxide plasma may be utilized to generate oxide layers on the substrate 101 and the nitride plasma may be utilized to generate nitride layers on the substrate 101. Generating the oxide plasma may include providing process gases TEOS, nitrous oxide ($N_2O$) and/or oxygen ($O_2$), and one or more inert gases from the gas supply system 140 to the processing volume 142. Further, generating the nitride plasma may include providing process gases silane, ammonia ($NH_3$), and nitrogen ($N_2$), and one or more inert gases from the gas supply system 140 to the processing volume 142. Further, to generate alternating layers of oxide and nitride, the operations of the process recipe may alternate between generating the oxide plasma and nitride plasma, and switching between providing the corresponding process gases and inert gases.

The controller 190 controls the valves 220, 222, 224 and 226 based on the operations of the process recipe to make the in-plane distortion more or less tensile and compressive for each of the layers. The controller 190 may control the valves 220, 222, 224 and 226 based on the operations of process recipe to generate a substantially neutral in-plane distortion. For example, the controller 190 opens one or more of the valves 220, 222, 224 and 226 to allow gas of a corresponding one of gas supplies 210, 212, 214 and 216 to flow into the manifold 240 in response to an operation of the process recipe. The length of time that the controller 190 instructs the valve or valves to remain open may correspond to when an operation within the process recipe occurs. For example, the length of time that the controller 190 instructs the valve or valves to remain open during a first operation may be less than or greater than the length of time that the controller 190 instructs the valve to remain open during a second operation that occurs after the first operation. Alternatively, the length of time that the controller 190 instructs the valve or valves to remain open during the first operation may be substantially similar to the length of time that the controller 190 instructs the valve to remain open during the second operation. Further, the amount of time a valve or valves are opened during each operation corresponding to the generation of a first plasma may differ from the amount of time a valve or valves may be opened during each operation corresponding to the generation of a second plasma. Further, the amount of time a valve or valves are opened during each operation of a process recipe may gradually increase in time during the processing of the substrate 101.

The controller 190 instructs one or more valves to be open during a first period of a first operation and a second period of a second operation of the process recipe. The first operation and second operation may both correspond to the generation of a first type of plasma, and the second operation may occur after the first operation. The length of the first period may be longer, shorter, or the same as the length of the second period. Further, the valves open during the first period may be the same as the valves open during the second period, or the valves open during the first period may differ from the valves open during the second period. For example, the number of valves open in each period may differ and/or which valve open during each period may vary. Accordingly, the controller 190 may instruct a first valve, e.g., the valve 220, to open for the first period corresponding to the first operation to provide gas from the gas supply 210 and the first valve to open for the second period corresponding to the second operation to provide gas from the gas supply 210. Alternatively, the controller 190 may instruct a first valve, e.g., the valve 220, to open for the first period corresponding to the first operation to provide gas from the gas supply 210 and a second valve, e.g., the valve 222, to open for the second period corresponding to the second operation to provide gas from the gas supply 212. Further, the controller 190 may instruct a first valve, e.g., valve 220, to open for the first period corresponding to the first operation to provide gas from the gas supply 210 and the first valve and a second valve to open for the second period corresponding to the second operation to provide gas from the gas supply 210 and the gas supply 212. Alternatively, the controller 190 may instruct a first valve, e.g., valve 220, and second valve, e.g., 222, to open for the first period corresponding to the first operation to provide gas from the gas supplies 210 and 212 and one of the first valve to open for the second period corresponding to the second operation to provide gas from one of the gas supplies 210 and 212.

Additionally, or alternatively, the controller 190 may control the valves 220, 222, 224 and 226 based sensed parameter of a process chamber 100 (e.g., the process chamber 100A or 100B). For example, the controller 190 may receive sensor data from one or more sensors positioned within a process chamber 100 (e.g., the process chamber 100A or 100B) and adjust the flow through one or more of the valves 220, 222, 224 and 226 in response. The sensor data may be data corresponding to the flow of process gases in one or more regions of the processing volume 108 and/or data corresponding to the plasma generated in the processing volume 108.

By controlling the flow rate of a gas and/or type of gas supplied to the gas distribution plenum 120, the thickness profile for a corresponding the layer formed on the substrate 101 may be altered, for example, by localized adjustment of precursor concentration. For example, silane may be utilized during a nitride plasma operation of the process recipe to alter a thickness profile of a corresponding nitride layer. The flow rate for silane may be in a range of about 1 sccm to about 20 sccm. Further, helium may be utilized during an oxide operation to adjust the thickness profile for a corresponding layer formed on the substrate 101.

The controller 190 may further control the valve 230 to control the flow rate of gas into the manifold 240. For example, the controller 190 may instruct the valve 230 to open and close to control the flow rate of gas or gases through the valve 230 into the manifold 240. Additionally, or alternatively, the controller 190 may control the manifold 240 to control the flow rate of gas or gases out of the manifold 240 by communicating one or more instructions to the manifold 240.

Figure 3:
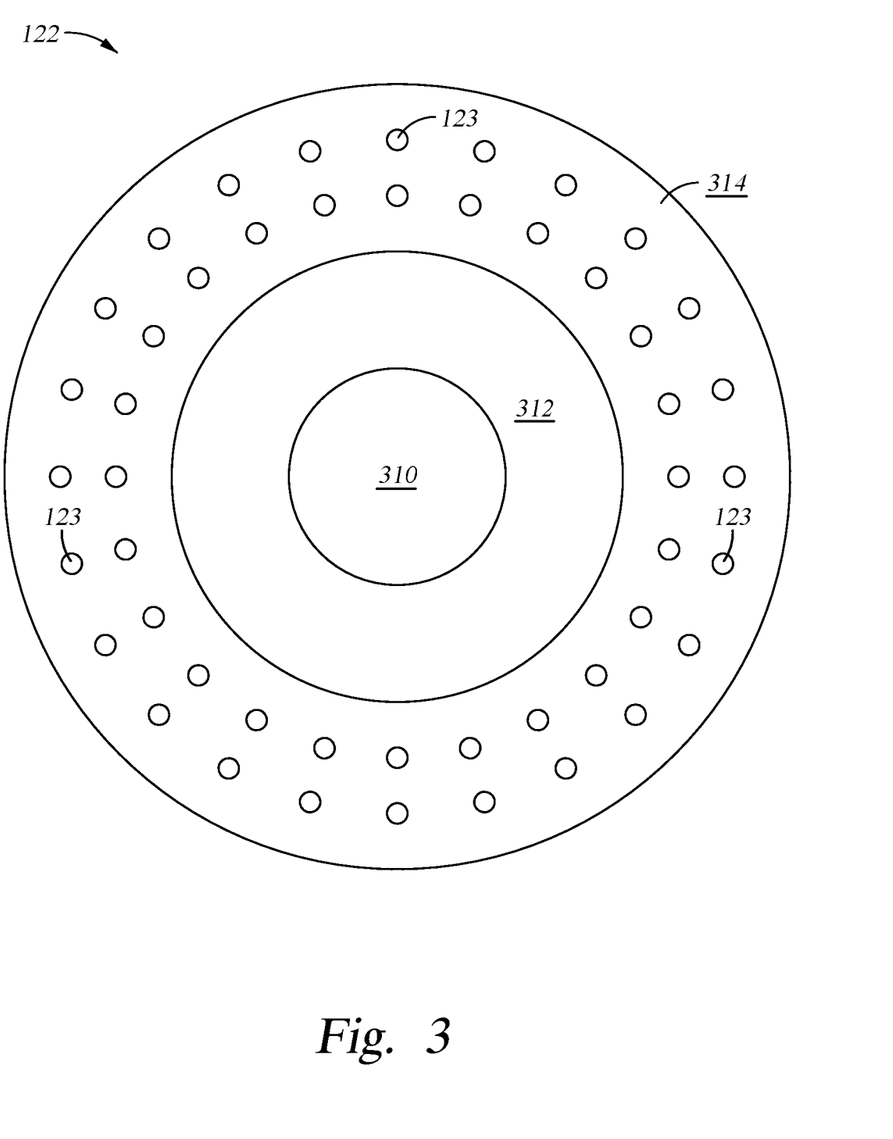
FIG. 3 is a schematic illustration of a distribution plate, according to one or more embodiments.

FIG. 3 illustrates a top schematic view of the distribution plate 122. The distribution plate 122 includes a region 314 including the apertures 123. For example, the distribution plate 122 includes at least 16 apertures, which may be arranged in concentric circles. Alternatively, the distribution plate 122 includes less than 16 apertures. The apertures 123 are aligned with the gas distribution plenum 120 and control the flow of gas out of the gas distribution plenum. Further, the distribution plate 122 includes cavity 310 that is aligned with the central conduit 138. A non-perforated (e.g., free of apertures 123) region 312 is between the cavity 310 and the region 314. Additionally, the distribution plate 122 may be attached to the bottom of the gas box 114. For example, the distribution plate 122 may be welded to the bottom of the gas box 114. The size and/or location of the apertures 123 may be configured to provide a pressure drop of about 3× to about 5× across the apertures 123.

Figure 4:
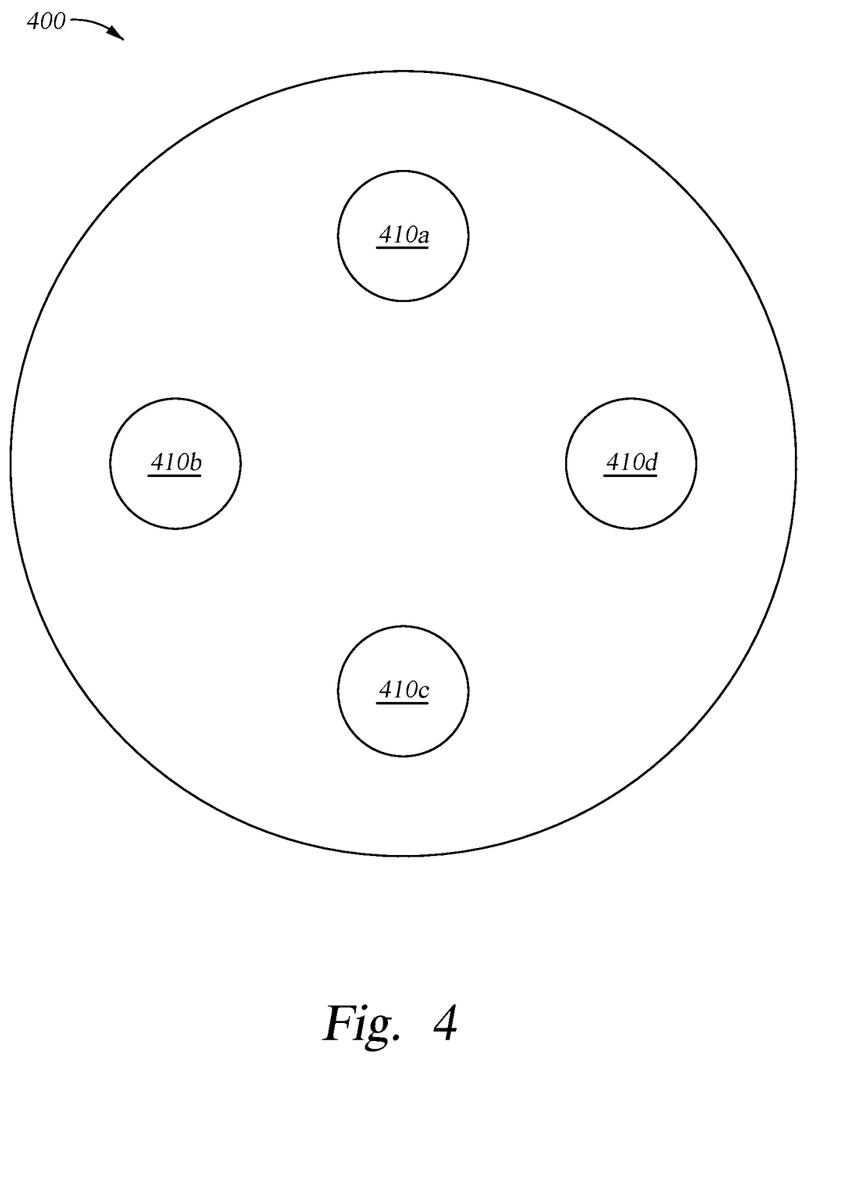
FIG. 4 is a schematic illustration of an injection point, according to one or more embodiments.

FIG. 4 illustrates a schematic bottom view of an injector point 400 for the gas distribution plenum 120. The injector point 400 is positioned between the conduit 143 and the gas distribution plenum 120. The gas distribution plenum 120 may include multiple injector points 400. Further, each injector point 400 may include one or more conduits 410. For example, as illustrated in FIG. 4, the injector point 400 includes four conduits, the conduits 410a-410d. Alternatively, the injector point 400 may include more or less than four conduits. Additionally, the conduits 410 maybe positioned in different positions than what is illustrated in FIG. 4.

Figure 5:
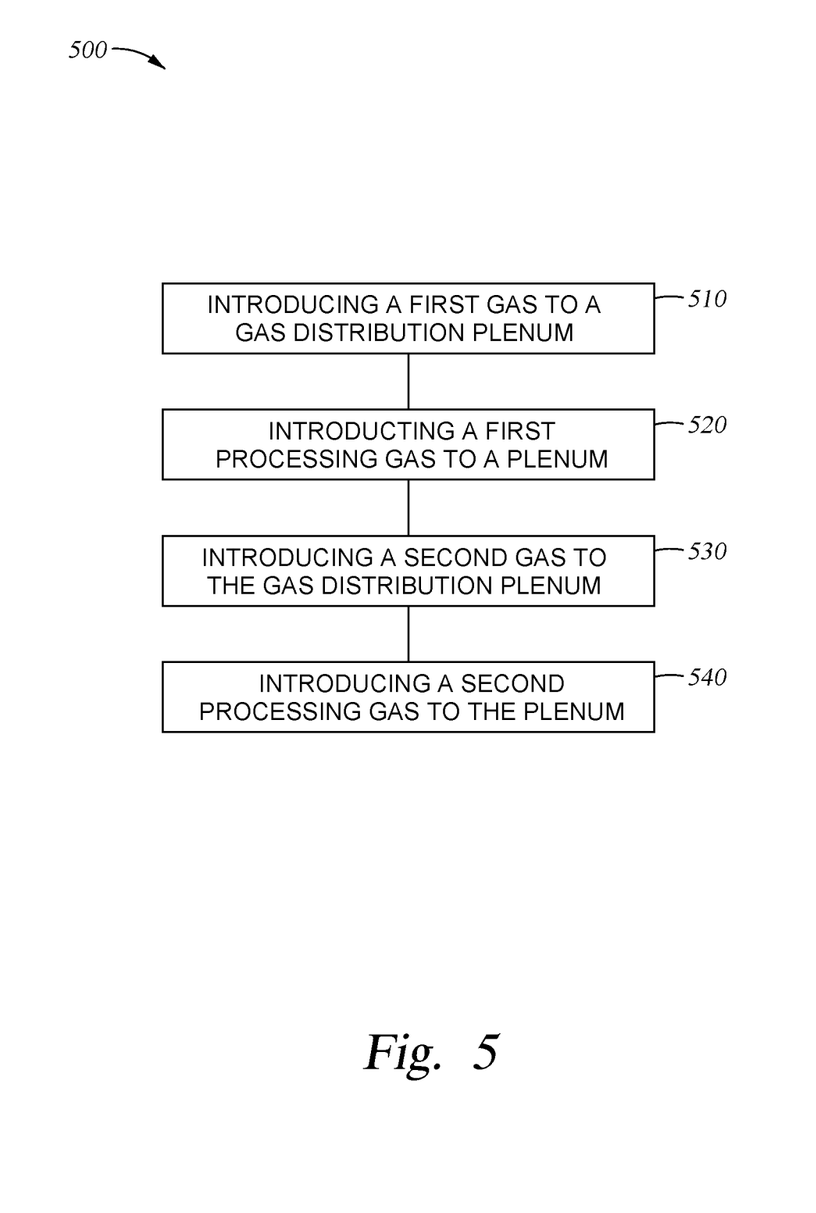
FIG. 5 illustrates a flowchart of a method for processing a substrate, according to one or more embodiments.

FIG. 5 is a flowchart of method 500 for processing a substrate, according to one or more embodiments. At operation 510, a first gas is introduced to a gas distribution plenum. For example, the controller 190 may instruct the gas supply system 144 to supply a first gas to the gas distribution plenum 120 based on a first operation of a process recipe.

The first gas may be a precursor or an inert gas. With reference to FIG. 2, the controller 190 may instruct the valve 220 to open for a first period such that a gas may flow out the gas supply 210 into the manifold 240 and into the gas distribution plenum 120. The controller 190 may instruct the valve 220 to open for the first period in response to a first operation of a process recipe for processing the substrate 101. The first operation may correspond to the generation of a first plasma within the processing volume 142.

The controller 190 may determine which valve 220, 222, 224, and 226 to be opened and the length of time for the valve to be open based on the operation of the process recipe. For example, the controller 190 may alter the amount of time and which valve 220, 222, 224, and 226 is opened based on when an operation occurs within the process recipe.

At operation 520, a processing gas is introduced to the plenum 124. For example, the controller 190 instructs the gas supply system 140 to supply a processing gas to the plenum 124 via the central conduit 138. The controller 190 may instruct the gas supply system to may supply the first processing gas to the plenum 124 based on the first operation of the process recipe. In one example, operations 510 and 520 occur concurrently.

Supplying the first gas based on the first operation of the process recipe may include supplying at least one of a first inert gas and a first precursor and/or selecting the rate of flow for the first gas corresponding to the process gas or gases output by the gas supply system 140 based on the first operation of the process recipe. For example, the first operation of the process recipe may include generating an oxide plasma to deposit an oxide layer on the substrate 101, and the gas supply system 144 may correspondingly output at least one of argon, helium and TEOS.

At operation 530, a second gas is introduced to the gas distribution plenum. For example, the controller 190 may instruct the gas supply system 144 to output a second gas based on a second operation of the process recipe. The second gas may be a precursor or an inert gas. With reference to FIG. 2, the controller 190 may instruct the valve 224 to open for a second period such that a gas may flow out the gas supply 214 into the manifold 240 and into the gas distribution plenum 120. The controller 190 may instruct the valve 224 to open for the second period in response to the second operation of a process recipe for processing the substrate 101. The first operation may correspond to the generation of a second plasma within the processing volume 142.

At operation 540, a second processing gas is introduced to the plenum 124. For example, the controller 190 instructs the gas supply system 140 to supply one or more processing gases based on the second operation of the process recipe to the plenum 124. Supplying the second gas may include supplying one or more of helium, argon and silane in response to the second operation of the process recipe corresponding to generating a nitride plasma in the processing volume 142 to deposit a nitride layer on the substrate 101. In one example, operations 530 and 540 occur concurrently.

The in-plane distortion within layers deposited on a substrate may be adjusted through the application of one or more inert gases and/or precursors to select regions of the processing volume. For example, one or more inert gases and/or precursors may be supplied to the gas distribution plenum 120 disposed within the gas box 114 and mixed with processing gases in the regions 121 of the plenum 124 to make the in-plane distortion more tensile or compressive of each layer, reducing the in-place distortion of each layer. Additionally, the application of one or more inert gases and precursors to select regions of the processing volume of the process chamber may adjust the thickness non-uniformity within layers deposited on a substrate.

While the foregoing is directed to embodiments of the present disclosure, other and further embodiments of the disclosure may be devised without departing from the basic scope thereof, and the scope thereof is determined by the claims that follow.

What is claimed is:

1. A method for processing a substrate comprising:
   introducing a first gas to a first plenum of a gas box, wherein
      the first gas flows out of the first plenum through a gas distribution plate to a second plenum formed between a blocker plate and the gas distribution plate,
      the gas distribution plate includes a central cavity, a first region, and a second region, wherein
      the first region has a first plurality of apertures in fluid communication with the first plenum, and
      the second region is free of apertures and is located between the central cavity and the first region;
   introducing a second gas through a conduit to the second plenum, wherein the conduit extends through the gas box and through the central cavity of the gas distribution plate to the second plenum; and
   introducing the first gas and the second gas from the second plenum to a processing volume of process chamber during a first time period, wherein a substrate is positioned on a substrate support in the processing volume during the first time period.

2. The method of claim 1, further comprising introducing the first gas and the second gas to a third plenum formed between a showerhead and the blocker plate, wherein the first gas and the second gas flow from the third plenum to the processing volume through the showerhead.

3. The method of claim 1, further comprising introducing the first gas to an additional plenum of the gas box, wherein the additional plenum is fluidly coupled to the first plenum.

4. The method of claim 3, wherein the first gas flows from the additional plenum to the second plenum through an additional plurality of apertures in the gas distribution plate.

5. The method of claim 1, wherein a first layer is deposited over the substrate during the first time period when the first gas and the second gas are introduced to the processing volume.

6. The method of claim 1, further comprising introducing a third gas to the first plenum during the first time period, wherein the third gas is an inert gas.

7. The method of claim 1, wherein the first gas is introduced during a first portion of the first time period and the second gas is introduced to the second plenum during a second portion of the first time period.

8. The method of claim 7, wherein the first portion of the first time period overlaps with the second portion of the first time period.

* * * * *